United States Patent [19]
Tran

[11] Patent Number: 5,942,801
[45] Date of Patent: Aug. 24, 1999

[54] BORDERLESS VIAS WITH HSQ GAP FILLED METAL PATTERNS HAVING HIGH ETCHING RESISTANCE

[75] Inventor: Khanh Q. Tran, San Jose, Calif.

[73] Assignee: Advanced Micro Devices, Inc., Sunnyvale, Calif.

[21] Appl. No.: 08/992,430

[22] Filed: Dec. 18, 1997

[51] Int. Cl.$^6$ ............................ H01L 23/48; H01L 23/52; H01L 29/40
[52] U.S. Cl. ............................................................ 257/758
[58] Field of Search .................................... 257/758, 759, 257/760; 438/781, 654, 628, 644, 622

[56] References Cited

U.S. PATENT DOCUMENTS

| | | | |
|---|---|---|---|
| 5,548,159 | 8/1996 | Jeng ........................................ | 257/634 |
| 5,656,543 | 8/1997 | Chung .................................... | 438/625 |
| 5,818,111 | 10/1998 | Jeng et al. ............................. | 257/776 |

OTHER PUBLICATIONS

A. J. Konecni et al., "A Stable Plasma Treated CVD Titanium Nitride Film for Barrier/Glue Layer Applications," VMIC Conference, Jun. 18–20, 1996, 1996 ISMIC –106/96/0181(c), pp. 181–183.

Kim et al., "Stability of TiN Films Prepared by Chemical Vapor Deposition Using Tetrakis–dimethylamino Titanium," Electrochem. Soc., vol. 143, No. 9, Sep. 1996, pp. L188–L190.

Iacoponi et al., "Resistivity Enhancement of CVD TiN With In–Situ Nitrogen Plasma and Its Application in Low Resistance Multilevel Interconnects," Advanced Metalization and Interconnect Systems for ULSI, 1995, (5 pages).

Eizenberg et al., "Chemical vapor deposited TiCN: A new barrier metallization for submicron via and contact applications," J. Vac. Sci. Technol. A, vol. 13, No. 3, May/Jun. 1995, pp. 590–595.

Eizenberg et al., "TiCN: A new chemical vapor deposited contact barrier metallization for submicron devices," (3 pages).

Hillman et al., "Comparison of Titanium Nitride Barrier Layers Produced by Inorganic and Organic CVD,"Jun. 9–10, 1992, VMIC Conference, 1992, ISMIC–101/92/0246, pp. 246–252.

Liu et al., "Integrated HDP Technology for Sub–0.25 Micron Gap Fill," Jun. 10–12, 1997, VMIC Conference, 1997, ISMIC–107/97/0618(c), pp. 618–619.

Bothra et al., "Integration of 0.25$\mu$m Three and Five Level Interconnect System for High Performance ASIC," Jun. 10–12, 1997, VMIC Conference, 1997, ISMIC–107/97/0043, pp. 43–48.

Wang et al., "Process Window Characterization of ULTIMA HDP–CVD$^{TM}$USG Film," Feb. 10–11, 1997, DUMIC Conference 1997 ISMIC–222D/97/0405, pp. 405–408, 619.

Saikawa et al., "High Density Plasma CVD for 0.3$\mu$m Device Application," Jun. 18–20, 1996, VMIC Conference 1996 ISMIC–106/96/0069(c), pp. 69–75.

Nguyen et al., "Characterization of High Density Plasma Deposited Silicon Oxide Dielectric for 0.25 Micron ULSI, "Jun. 27–29, 1995, VMIC Conference 1995 ISMIC–104/95/0069, pp. 69–74.

*Primary Examiner*—Brian Dutton

[57] ABSTRACT

Spacings between metal features are gap filled with HSQ. Portions of the deposited HSQ adjoining the side surfaces and upper surface of a metal feature are selectively heated to increase the density and etch resistance of the adjoining HSQ portions, thereby enabling formation of reliable, voidless, low resistance, borderless vias. In an embodiment of the present invention, selective heating is effected by heating a metal line to indirectly heat the adjoining portions of the HSQ layer, as by infrared heating.

13 Claims, 4 Drawing Sheets

BORDERLESS VIAS WITH HSQ GAP FILLED METAL PATTERNS HAVING HIGH ETCHING RESISTANCE

TECHNICAL FIELD

The present invention relates to a high density, multi-metal layer semiconductor device with reliable interconnection patterns. The invention has particular applicability in manufacturing high density multi-metal layer semiconductor devices with design features of 0.25 microns and under.

BACKGROUND ART

The escalating requirements for high densification and performance associated with ultra large scale integration semiconductor devices require design features of 0.25 microns and under, such as 0.18 microns, increased transistor and circuit speeds, high reliability and increased manufacturing throughput. The reduction of design features to 0.25 microns and under challenges the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric layer on a semiconductor substrate, typically monocrystalline silicon, with conductive contacts formed therein for electrical connection with an active region on the semiconductor substrate, such as a source/drain region. A metal layer, such as aluminum or an aluminum alloy, is deposited on the first dielectric layer, and a photoresist mask is formed on the metal layer having a pattern corresponding to a desired conductive pattern. The metal layer is then etched through the photoresist mask to form the conductive pattern comprising metal features separated by gaps, such as a plurality of metal lines with interwiring spacings therebetween. A dielectric layer is then applied to the resulting conductive pattern to fill in the gaps and the surface is planarized, as by conventional etching or chemical-mechanical polishing (CMP) planarization techniques.

As shown in FIGS. 1 and 2, conventional practices comprise depositing metal layer 11 on dielectric layer 10 which is typically formed on a semiconductor substrate containing an active region with transistors (not shown). After photolithography, etching is then conducted to form a patterned metal layer comprising metal features 11a, 11b, 11c and 11d with gaps therebetween. A dielectric material 12, such as spin on glass (SOG), is typically deposited to fill in the gaps between the metal features, and baked at a temperature of about 300° C. to about 450° C., for a period of time up to about two hours, depending upon the particular SOG material employed, to effect planarization. Planarization, as by CMP, is then performed.

As feature sizes, e.g., metal lines and interwiring spacings, shrink to 0.25 microns and below, such as 0.18 microns, it becomes increasingly difficult to satisfactorily fill in the interwiring spacings voidlessly and obtain adequate step coverage. It also becomes increasingly difficult to form a reliable interconnection structure. A through-hole is typically formed in a dielectric layer to expose an underlying metal feature, wherein the metal feature serves as a landing pad occupying the entire bottom of the through-hole. Upon filling the through-hole with conductive material, such as a metal plug to form a conductive via, the entire bottom surface of the conductive via is in direct contact with the metal feature. Such a conventional technique is illustrated in FIG. 3, wherein metal feature 30 of a first patterned metal layer is formed on first dielectric layer 31 and exposed by through-hole 32 formed in second dielectric layer 33. In accordance with conventional practices, through-hole 32 is formed so that metal feature 30 encloses the entire bottom opening, thereby serving as a landing pad for metal plug 34 which fills through-hole 32 to form conductive via 35. Thus, the entire bottom surface of conductive via 35 is in direct contact with metal feature 30. Conductive via 35 electrically connects metal feature 30 and metal feature 36 which is part of a second patterned metal layer. As shown in FIGS. 2 and 3, the side edges of a metal feature or conductive line, e.g., 30A, 30B, and 36A, and 36B, taper somewhat as a result of etching.

The reduction of design features to the range of 0.25 microns and under requires extremely high densification. The conventional practice of forming a landing pad completely enclosing the bottom surface of a conductive via utilizes a significant amount of precious real estate on a semiconductor chip which is antithetic to escalating high densification requirements. In addition, it is extremely difficult to voidlessly fill through-holes having such reduced dimensions because of the extremely high aspect ratio, i.e., height of the through-hole with respect to diameter of the through-hole. Accordingly, conventional remedial techniques comprise purposely widening the diameter of the through-hole to decrease the aspect ratio. As a result, misalignment occurs wherein the bottom surface of the conductive via is not completely enclosed by the underlying metal feature. This type of via is called a "borderless via", which also conserves chip real estate.

The use of borderless vias, however, creates new problems. For example, as a result of misalignment, the SOG gap filling layer is penetrated by etching when forming a through-hole, due to the low density and poor stability of SOG. As a result of such penetration, moisture and gas accumulate thereby increasing the resistance of the interconnection. Moreover, spiking can occur, i.e., penetration of the metal plug to the substrate, causing a short. For example, adverting to FIG. 4, first dielectric layer 41 is formed on substrate 40 and a first metal pattern comprising a first metal feature, e.g., metal line 45, is formed on first dielectric layer 21 gap filled with SOG 42. Dielectric layer 43 is then deposited and a through-hole formed therein exposing a portion of the upper surface and at least a portion of a side surface of first metal feature 45 and exposing a portion of SOG 42. Upon filling the through-hole with a metallic plug 44, typically comprising an initial barrier layer (not shown) and tungsten, spiking occurs, i.e., penetration through to substrate 40, thereby causing shorting.

Another problem generated by reducing the size of metal lines below about 0.25 microns is that it becomes increasingly difficult to voidlessly gap fill interwiring spacings with a dielectric material, such as SOG. Hydrogen silsesquioxane (HSQ) offers many advantages for use in interconnect patterns. HSQ is relatively carbon free, thereby avoiding poison via problems. Moreover, the absence of carbon renders it unnecessary to etch back HSQ below the upper surface of the metal lines to avoid shorting. In addition, HSQ exhibits excellent planarity and is capable of gap filling interwiring spacings less than 0.15 microns employing conventional spin-on equipment. HSQ undergoes a melting phase at approximately 200° C., but does not convert to the high dielectric constant glass phase until reaching temperatures of about 400° C. for intermetal applications and about 700° C. to about 800° C. for premetal applications.

However, the use of HSQ presents problems, particularly in borderless via applications. Typically, when forming a borderless via, a photoresist mask is deposited and the through-hole etched to expose a portion of an upper surface and a portion of a side surface of a metal line. The photoresist mask is then stripped employing an oxygen ($O_2$)-containing plasma. It was found that the $O_2$-containing plasma employed to strip the photoresist mask degraded the HSQ layer so that, upon subsequent introduction of a barrier material, such as titanium nitride or titanium-titanium nitride, spiking occurred, i.e., the barrier material penetrated through the HSQ layer.

HSQ typically contains between about 70% and about 90% Si—H bonds. However, upon exposure to an $O_2$-containing plasma, a considerable number of Si—H bonds are broken and Si—OH bonds are formed. Upon treatment with an $O_2$-containing plasma, as much as about 20% to about 30% of the Si—H bonds in the as deposited HSQ film are broken. In addition, it was found that exposure to an $O_2$-containing plasma increased the moisture content of the as deposited HSQ film and its propensity to absorb moisture. An HSQ film having reduced Si—H bonds and high Si—OH bonds tends to absorb moisture from the ambient, which moisture outgases during subsequent barrier metal deposition. Thus, it was found that during subsequent barrier metal deposition, outgasing occurred thereby creating voids leading to incomplete electrical connection.

In copending application Ser. No. 08/951,592, filed on Oct. 16, 1997, a method is disclosed for restoring degradation of an HSQ film by exposure to an $H_2$-containing plasma to increase the number of Si—H bonds, decrease the number of Si—OH bonds, and decrease the propensity to absorb moisture. The disclosed treatment with an $H_2$-containing plasma enables the use of HSQ to gap fill metal lines and form borderless vias with improved reliability increasing the reliability of the vias by reducing outgasing and, hence, void formation.

It was found, however, that HSQ does not exhibit sufficient etching resistance, particularly when etching to form a misaligned through-hole for a borderless via. As a result, during etching to form the misaligned through-hole, the etchant penetrates through the HSQ layer to the substrate. Upon filling the through-hole with conductive material, spiking occurs leading to shorting.

Accordingly, there exists a need to improve the etching resistance of a gap filled HSQ layer, thereby improving the reliability of borderless vias. There also exists a need for technology enabling the use of HSQ for gap filling metal features having dimensions below 0.25 microns in forming interconnection patterns comprising borderless vias without significantly increasing the dielectric constant of the HSQ layer.

DISCLOSURE OF THE INVENTION

An object of the present invention is a method of manufacturing a high density, multi-metal layer semiconductor device with design features of 0.25 microns and under, and an interconnection pattern comprising borderless vias with high integrity.

Another object of the present invention is a high density, multi-metal layer semiconductor device with design features of 0.25 microns and under, and an interconnection pattern comprising high integrity borderless vias.

Additional objects, advantages and other features of the present invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device comprising: forming a first conductive feature having an upper surface and side surfaces; depositing a layer of hydrogen silsesquioxane (HSQ) on the upper surface and side surfaces of the first conductive feature; and selectively heating portions of the HSQ layer adjoining the upper and side surfaces of the first conductive feature to increase the density and etching resistance of the selectively heated adjoining portions of the HSQ layer above the density and etching resistance of portions of the HSQ layer which do not adjoin the first conductive feature.

Another aspect of the present invention is a semiconductor device comprising a multi-level interconnection pattern having: a first conductive feature comprising an upper surface and side surfaces; and a layer of hydrogen silsesquioxane (HSQ) on the upper surface and side surfaces of the first conductive feature, wherein the HSQ layer comprises portions adjoining the upper and side surfaces of the first conductive feature, the adjoining HSQ portions have a higher density and greater resistance to etching than portions of the HSQ film which do not adjoin the first metal feature.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
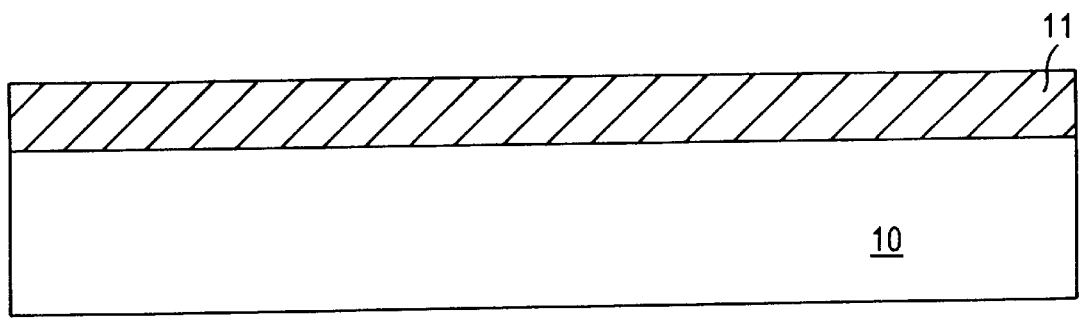
FIGS. 1 and 2 schematically illustrate conventional methodology in gap filling a patterned metal layer.
Figure 2:
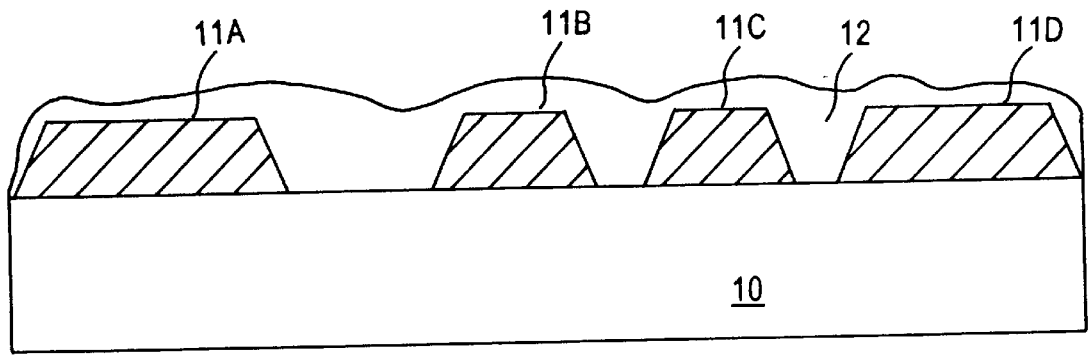
Figure 3:
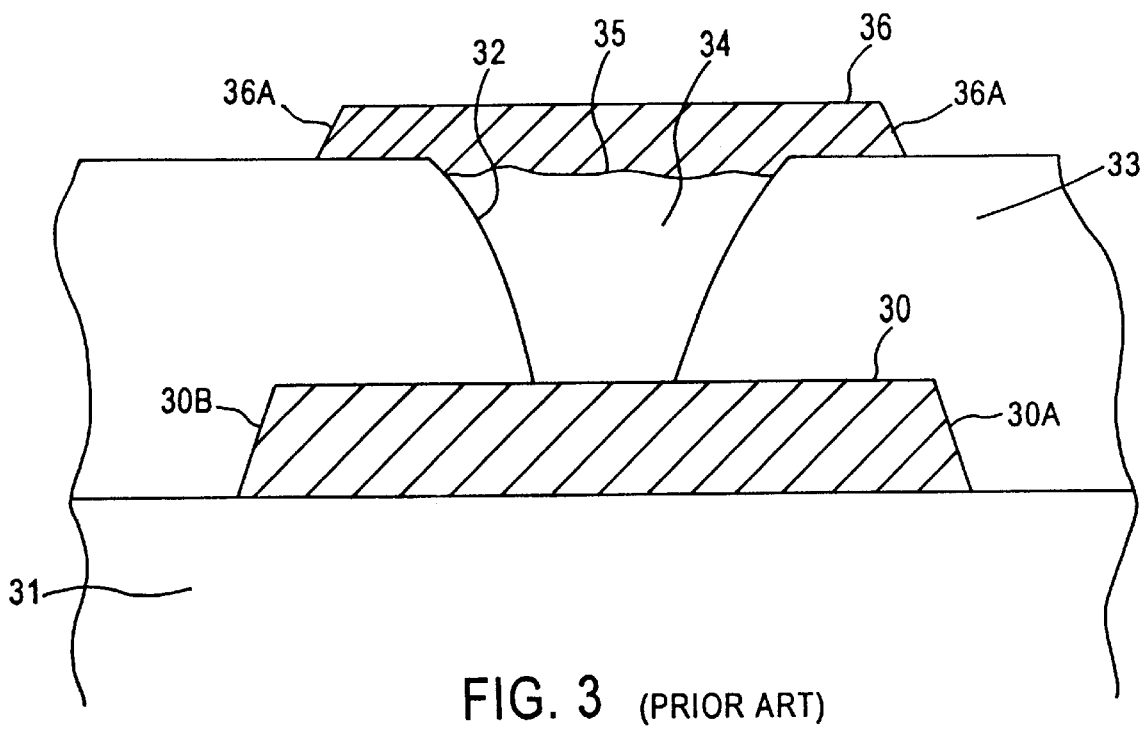
FIG. 3 schematically illustrates a conventional metal plug via interconnection.
Figure 4:
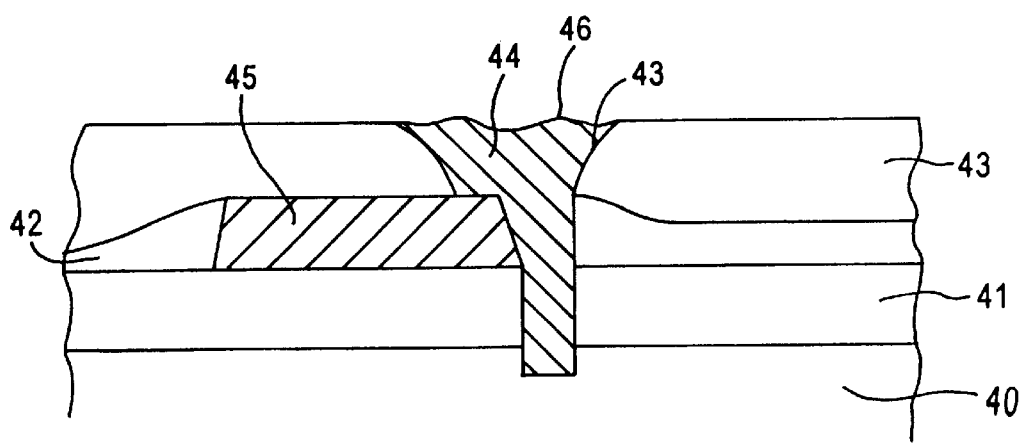
FIG. 4 schematically illustrates spiking in a conventional borderless via.

The present invention enables the use of borderless vias in forming high density, multi-metal layer semiconductor devices having design features of about 0.25 microns and under, employing HSQ to fill gaps in patterned metal layers with highly reliable interconnections, including interconnections containing borderless vias. In accordance with the present invention, portions of the HSQ layer adjoining metal features are selectively heated so that the selectively heated portions undergo an increase in density and etching resistance. Upon forming a misaligned through-hole for a borderless via, the high density adjoining portions of the HSQ layer provide sufficient etching resistance to prevent penetration below the metal feature and, hence, subsequent shorting.

In accordance with the present invention, an HSQ layer deposited on a metal feature is selectively heated to increase so that portions adjoining the upper and side surfaces of the metal feature undergo an increase in density and etching resistance. Preferably, the selectively heated adjoining portions have a density and etching resistance significantly higher than portions of the HSQ layer which do not adjoin the metal feature. In accordance with an embodiment of the present invention, indirect heating of the adjoining portions of the HSQ layer is effected by heating the metal feature itself which act as a heat sink which, in turn, heats the adjoining portions of the HSQ layer by conduction. In an aspect of this embodiment, the metal feature is heated by infrared radiation. The metal feature can also be heated by other means as, for example, a laser, such as a pulsed laser tuned the frequency of infrared radiation, e.g., about 0.75 to about 5 microns.

In accordance with the above-mentioned embodiment of the present invention, the directly heated metal feature, such as a metal line, conducts heat to adjoining portions of the HSQ layer filling interwiring spacings. Accordingly, a thermal gradient is established wherein the hottest portion is adjacent the surface of the metal line. Consequently, the density and etching resistance of the selectively heated portions of the HSQ layer gradually decrease from the surface of the metal feature, i.e., gradually decrease through the selectively heated adjoining portions toward non-adjoining portions. The density of the adjoining portions, after selective heating in accordance with the present invention, is typically greater than about 4, while the density of the non-adjoining portions is typically less than about 4. Typically, the density of the adjoining portions ranges from about 4 to about 4.2, while the density of the non-adjoining portions ranges from about 3 to about 3.3.

The exact mechanism underlying the increase in density and etching resistance of selectivity heated adjoining portions of the HSQ layer is not known with certainty. However, it is believed that selective heating of the adjoining portions of the HSQ layer causes a phase transformation to the glass phase, which typically occurs at temperatures of about 450° C., leaving the non-adjoining portions polymeric. The glass phase exhibits higher density and higher etching resistance as well as a higher dielectric constant than the untransformed polymer. In order to maintain the interconnection pattern at a desirably low resistance, only the adjoining portions of the HSQ layer are heated to convert to the glass phase, thereby minimizing the increase in the overall dielectric constant of the HSQ layer.

The dielectric constant of the selectively heated adjoining portions of the HSQ layer also gradually decreases through the adjoining portions toward the non-adjoining portions. One having ordinary skill in the art can easily optimize the degree of selective heating to achieve the objectives of the present invention while minimizing the extent of conversion of the adjoining portions to the glass phase and, hence, minimize the overall dielectric constant of the HSQ layer.

Semiconductor devices comprising metal lines about 0.25 microns usually have interwiring spacings of about 0.35 to about 0.45 microns. HSQ easily fills interwiring spacings of under 0.15 microns. In accordance with the present invention, portions of the HSQ layer adjoining the metal lines are selectively heated to convert the adjoining portions to a glass phase, typically having a thickness of up to about 0.1 microns. Thus, in accordance with the present invention, HSQ is effectively used to gap fill interwiring spacings between conductive lines having minimal dimensions of less than about 0.25 microns, e.g., less than about 0.18 microns, while enabling the formation of highly reliable borderless vias, by improving the etching resistance of portions of the HSQ layer adjoining metal lines.

Figure 5:
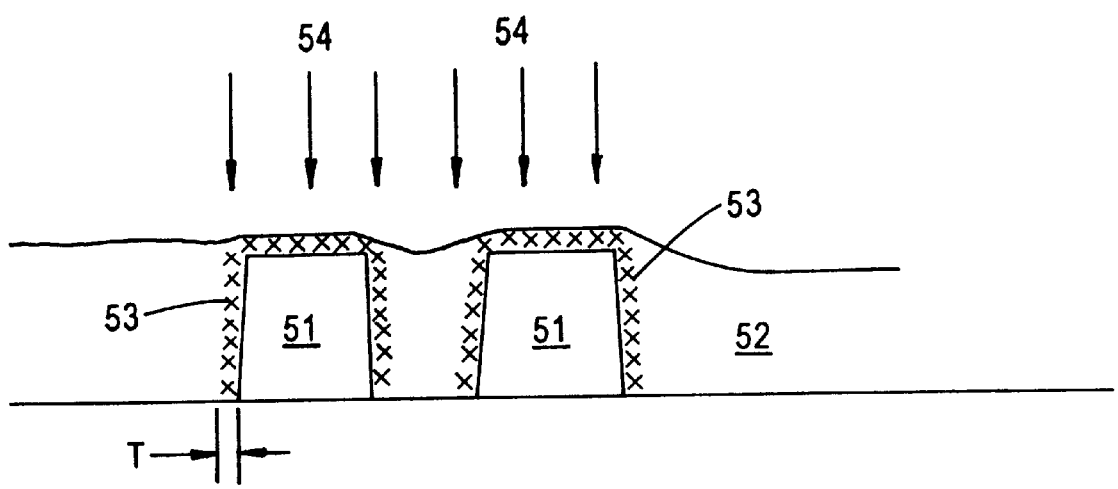
FIG. 5 schematically illustrates a selective heating of a gap filled HSQ layer.

An embodiment of the present invention is schematically illustrated in FIG. 5, wherein metal features 51 are formed on dielectric layer 50 and gap filled with HSQ 52. The arrows 54 denote infrared heating to heat metal lines 51 which act as heat sinks and, in turn, heat adjoining portions of HSQ layer 52. The selectively heated adjoining portions indicated by X marks with reference numeral 53, exhibit a higher density and higher etch resistance than non-adjoining portions, as well as a higher dielectric constant than non-adjoining portions. The selectively heated adjoining portions 53 of HSQ layer 52 are formed at a thickness sufficient to avoid penetration during etching to form a misaligned through-hole for a borderless via, thereby minimizing the increase in the overall dielectric constant of the HSQ layer.

Figure 6:
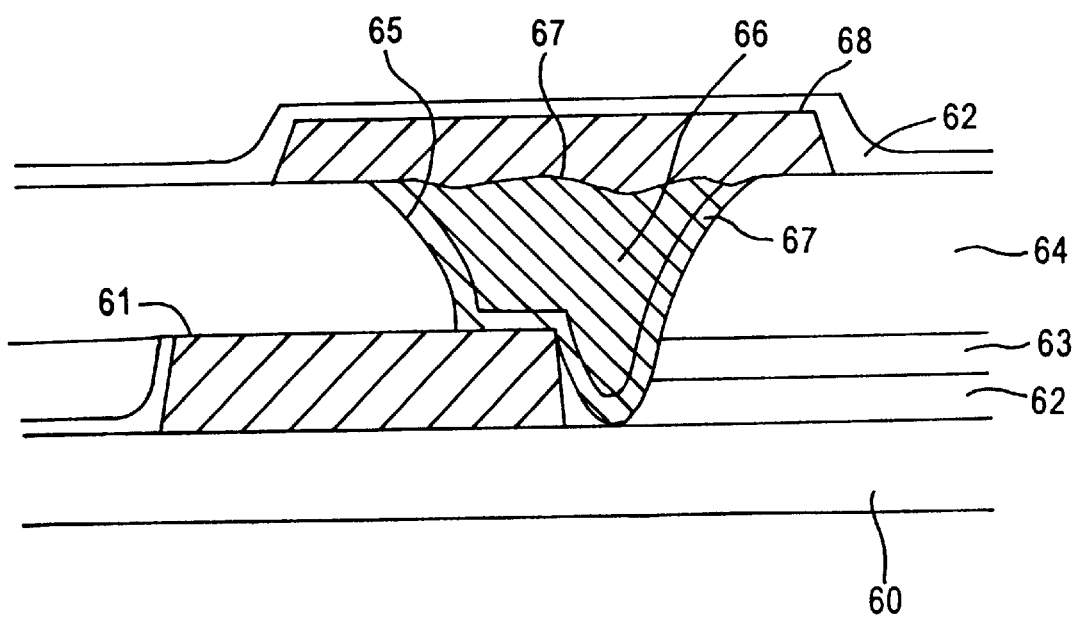
FIG. 6 schematically illustrates a borderless via formed according to the present invention.

A borderless via formed in accordance with an embodiment of the present invention is schematically illustrated in FIG. 6, wherein metal feature 61 of a patterned metal layer is formed on dielectric layer 60. Gaps between metal features of the patterned metal layer are filled with HSQ layer 62, wherein HSQ layer 62 has portions adjoining the upper and side surfaces of the first metal feature which have a higher density and greater resistance to etching than portions of the HSQ layer 62 which do not adjoin the first metal features. Optionally, an oxide derived from tetraethyl orthosilicate (TEOS) 63 is deposited and CMP performed. A second dielectric layer 64 is then deposited and a misaligned through-hole 65 formed therein for a borderless via. The bottom of through-hole 65 exposes a portion of the upper surface, and a portion of the side surface of metal feature 61 and penetrates and exposes the HSQ layer 62. Due to the improved etching resistance of the selectively heated adjoining portions (53 shown in FIG. 5), through-hole 65 does not penetrate to or through first dielectric layer 60.

Through-hole 65 is then filled with a conductive plug comprising a barrier layer 67 which serves as an adhesion promoter for subsequently deposited tungsten 66. Adhesion promoting layer 67 can comprise a refractory metal typically employed for improving the adhesion of tungsten to an underlying aluminum or aluminum-alloy feature. Such a refractory material can be titanium, titanium nitride, titanium-tungsten or titanium-titanium nitride.

Titanium-titanium nitride can be sputter deposited, while titanium nitride can be deposited by CVD as disclosed in copending application Ser. No. 08/924,131, filed Sep. 5, 1997. Embodiments of the present invention include forming a composite patterned metal layer comprising an initial tungsten layer, and intermediate layer comprising aluminum or an aluminum alloy, and an upper anti-reflective coating, such as titanium-titanium nitride.

After formation of conductive via 67, a second patterned metal layer is formed on second dielectric layer 64 and comprises metal feature 68 electrically connected to metal feature 61 through conductive via 67. The process is then repeated by gap filling the second pattern metal layer employing HSQ and selective heating in accordance with the present invention until the desired number of patterned metal layers are formed and gap filled, e.g., five metal layers. In repeating the process in accordance with the present invention, a second HSQ layer is deposited (also designated by reference numeral 62 in FIG. 6), which has portions adjoining the upper and side surfaces of the upper metal feature 68.

The present invention is applicable to the production of various types of semiconductor device, particularly high density, multi-metal patterned layers with submicron features, particularly submicron features of about 0.25 microns and below, exhibiting high speed characteristics and improved reliability. The present invention enables the advantageous use of HSQ to gap fill patterned metal layers without penetration when forming a misaligned through-hole for a borderless via, by selectively increasing the density and etching resistance of portions of the HSQ gap filled layer adjoining the metal features. The present invention is cost effective and can easily be integrated into conventional processing equipment.

In carrying out the embodiments of the present invention, the metal layers can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of CVD processes, including low pressure chemical vapor deposition (LPCVD), and plasma enhanced chemical vapor deposition (PECVD). Normally, when high melting metal point metals such as tungsten are deposited, CVD techniques are employed. Low melting point metals, such as aluminum and aluminum-base alloys, including aluminum-copper alloys, can also be deposited by melting, sputtering, or physical vapor deposition (PVD).

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A semiconductor device comprising a multi-level interconnection pattern having:
   a first conductive feature comprising an upper surface and first and second side surfaces; and
   a hydrogen silsesquioxane (HSQ) layer on the upper surface and the first and second side surfaces of the first conductive feature, wherein the HSQ layer comprises portions adjoining the upper and the first and second side surfaces of the first conductive feature which have a higher density and greater resistance to etching than portions of the HSQ layer which do not adjoin the upper and the first and second side surfaces of the conductive feature.

2. The semiconductor device according to claim 1, wherein the first conductive feature comprises a first metal feature.

3. The semiconductor device according to claim 2, wherein the density and resistance to etching of the HSQ layer gradually decrease within the adjoining portions toward the non-adjoining portions.

4. The semiconductor device according to claim 3, wherein the adjoining HSQ portions have a dielectric constant higher than the non-adjoining HSQ portion.

5. The semiconductor device according to claim 4, wherein the dielectric constant of the adjoining portions is greater than about 4, and the dielectric constant of the non-adjoining portions is less than about 4.

6. The semiconductor device according to claim 5, wherein the dielectric constant of the adjoining portions is about 4 to about 4.2, and the dielectric constant of the non-adjoining portions is about 3 to about 3.3.

7. The semiconductor device according to claim 4, wherein the dielectric constant of HSQ layer gradually decreases within the adjoining portions toward the non-adjoining portions.

8. The semiconductor device according to claim 2, comprising:
   a first dielectric layer formed on a semiconductor substrate;
   a first patterned metal layer having gaps formed on the first dielectric layer, the first patterned metal layer comprising the first metal feature;
   the layer of HSQ filling the gaps;
   a second dielectric layer formed on the first patterned metal layer and the HSQ layer;
   a through-hole formed in the second dielectric layer penetrating the HSQ layer and exposing a portion of the upper surface and at least a portion of a side surface of the first metal feature and exposing a portion of the HSQ layer; and
   a conductive material filling the through-hole to form a borderless via.

9. The semiconductor device according to claim 8, wherein the conductive material is a composite comprising a first conductive barrier layer which acts as an adhesion promoter for a second conductive layer.

10. The semiconductor device according to claim 9, wherein the first patterned metal layer comprising titanium, titanium-tungsten, titanium nitride or titanium-titanium nitride, and the second conductive layer comprises aluminum or an aluminum alloy.

11. The semiconductor device according to claim 2, wherein the metal feature is part of a patterned metal layer comprising a plurality of metal features, and the metal features comprise metal lines and the gaps comprise inter-wiring spacings.

12. The semiconductor device according to claim 11, wherein the portions of HSQ adjoining the upper and the side surfaces of the first metal feature have a thickness up to about 0.1 micron.

13. The semiconductor device according to claim 2, wherein the portions of HSQ adjoining the upper and the side surfaces of the first metal features exhibit a glass phase.

* * * * *

UNITED STATES PATENT AND TRADEMARK OFFICE
CERTIFICATE OF CORRECTION

PATENT NO. : 5,942,801
DATED : August 24, 1999
INVENTOR(S) : Khanh Q. Tran

It is certified that error appears in the above-identified patent and that said Letters Patent is hereby corrected as shown below:

In Claim 1, line 8, after "upper" insert --surface-- and in Claim 1, line 12, after "upper" insert --surface--.

Signed and Sealed this

Twenty-fifth Day of January, 2000

Attest:

Attesting Officer

*Acting Commissioner of Patents and Trademarks*